United States Patent
Serban et al.

(10) Patent No.: US 8,148,632 B2
(45) Date of Patent: Apr. 3, 2012

(54) QUANTUM DOT SOLAR CELL

(75) Inventors: Bogdan Serban, Bucharest (RO); Mihai N. Mihaila, Bucharest (RO); Viorel Georgel Dumitru, Prahova (RO); Cazimir Bostan, Bucharest (RO); Stephan Dan Costea, Bucharest (RO); Mircea Bercu, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 324 days.

(21) Appl. No.: 12/502,782

(22) Filed: Jul. 14, 2009

(65) Prior Publication Data

US 2010/0012191 A1 Jan. 21, 2010

Related U.S. Application Data

(60) Provisional application No. 61/080,949, filed on Jul. 15, 2008.

(51) Int. Cl.
*H01L 35/00* (2006.01)
*C07D 501/00* (2006.01)

(52) U.S. Cl. ........ 136/263; 540/215; 540/225; 540/227; 540/229; 540/230

(58) Field of Classification Search .......... 136/243, 136/252, 263; 540/215, 216, 217, 218, 219, 540/220, 221, 22, 223, 224, 225, 226, 227, 540/228, 229, 230
See application file for complete search history.

(56) References Cited

U.S. PATENT DOCUMENTS

| | | | |
|---|---|---|---|
| 4,927,721 | A | 5/1990 | Gratzel et al. |
| 5,677,545 | A | 10/1997 | Shi et al. |
| 6,566,595 | B2 | 5/2003 | Suzuki |
| 6,919,119 | B2 | 7/2005 | Kalkan et al. |
| 7,032,209 | B2 | 4/2006 | Kobayashi |
| 7,042,029 | B2 | 5/2006 | Graetzel et al. |
| 7,202,412 | B2 | 4/2007 | Yamanaka et al. |
| 7,202,943 | B2 | 4/2007 | Chang et al. |
| 7,268,363 | B2 | 9/2007 | Lenhard et al. |
| 7,462,774 | B2 | 12/2008 | Roscheisen et al. |
| 7,563,507 | B2 | 7/2009 | Emrick et al. |
| 7,655,860 | B2 | 2/2010 | Parsons |

(Continued)

FOREIGN PATENT DOCUMENTS

EP 1473745 11/2004

(Continued)

OTHER PUBLICATIONS

Diguna et al., "High Efficiency of CdSe Quantum-Dot-Sensitized TiO2 Inverse Opal Solar Cells," Applied Physics Letters, vol. 91, No. 023116, 3 pages, 2007.

(Continued)

*Primary Examiner* — Basia Ridley
*Assistant Examiner* — Alexander Kollias
(74) *Attorney, Agent, or Firm* — Seager, Tufte & Wickhem LLC (57) ABSTRACT

Example solar cells and methods for making and using the same are disclosed. An example solar cell may include an electron conductor layer, a quantum dot layer, a bifunctional ligand layer coupling the electron conductor layer and the quantum dot layer, and a hole conductor layer coupled to the quantum dot layer. The bifunctional ligand layer may include an antibiotic, and in some cases, a cephalosporin-based antibiotic.

13 Claims, 2 Drawing Sheets

U.S. PATENT DOCUMENTS

| | | |
|---|---|---|
| 2005/0028862 A1 | 2/2005 | Miteva et al. |
| 2005/0155641 A1* | 7/2005 | Fafard ............................ 136/249 |
| 2006/0021647 A1 | 2/2006 | Gui et al. |
| 2006/0169971 A1 | 8/2006 | Cho et al. |
| 2006/0263908 A1 | 11/2006 | Hirai |
| 2007/0025139 A1 | 2/2007 | Parsons |
| 2007/0028959 A1 | 2/2007 | Lee et al. |
| 2007/0062576 A1 | 3/2007 | Duerr et al. |
| 2007/0089784 A1* | 4/2007 | Noh et al. ...................... 136/263 |
| 2007/0119048 A1 | 5/2007 | Li et al. |
| 2007/0120177 A1 | 5/2007 | McGregor et al. |
| 2007/0122927 A1 | 5/2007 | Li et al. |
| 2007/0123690 A1 | 5/2007 | Parham et al. |
| 2007/0243718 A1 | 10/2007 | Shiratori et al. |
| 2008/0011349 A1* | 1/2008 | Raffaele et al. ............... 136/249 |
| 2008/0110494 A1 | 5/2008 | Reddy |
| 2008/0264479 A1 | 10/2008 | Harris et al. |
| 2009/0114273 A1 | 5/2009 | Kamat |
| 2009/0159120 A1 | 6/2009 | Wang et al. |
| 2009/0159124 A1 | 6/2009 | Mihaila et al. |
| 2009/0159131 A1 | 6/2009 | Zheng et al. |
| 2009/0159999 A1 | 6/2009 | Zheng et al. |
| 2009/0211634 A1 | 8/2009 | Serban et al. |
| 2009/0260682 A1* | 10/2009 | Serban et al. ................. 136/256 |
| 2009/0260683 A1 | 10/2009 | Serban et al. |
| 2009/0283142 A1 | 11/2009 | Serban et al. |
| 2010/0006148 A1 | 1/2010 | Zheng et al. |
| 2010/0012168 A1 | 1/2010 | Mihaila et al. |
| 2010/0043874 A1 | 2/2010 | Liu |
| 2010/0116326 A1 | 5/2010 | Gur et al. |
| 2010/0193025 A1 | 8/2010 | Serban et al. |
| 2010/0193026 A1 | 8/2010 | Serban et al. |
| 2010/0326499 A1 | 12/2010 | Liu |

FOREIGN PATENT DOCUMENTS

| | | |
|---|---|---|
| EP | 1689018 | 8/2006 |
| EP | 1936644 | 6/2008 |
| JP | 2008177099 | 7/2008 |
| WO | WO 2004/017345 | 2/2004 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |
| WO | WO 2008/018936 * | 2/2008 |

OTHER PUBLICATIONS

Banerjee et al., "Synthesis and Characterization of Carbon Nanotube-Nanocrystal Heterostructures," Nano Letters, vol. 2, No. 3, pp. 195-200, 2002.

Clarke et al., "Photophysics of Dopamine-Modified Quantum Dots and Effects on Biological Systems," Nature Materials, vol. 5, pp. 409-417, May 2006.

Gebeyehu et al., "Hybrid Solar Cells Based on Dye-Sensitized Nanoporous $TiO_2$ Electrodes and Conjugated Polymers as Hole Transport Materials," Synthetic Metals, vol. 125, pp. 279-287, 2002.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.

Landes et al., "On the Nanoparticle to Molecular Size Transition: Flourescence Quenching Studies," vol. 105, No. 43, pp. 10554-10558, 2001.

Law et al., "ZnO-$Al_2O_3$ and ZnO-$TiO_2$ Core-Shell Nanowire Dye-Sensitized Solar Cells," Journal Phys. Chemistry B, vol. 110, No. 45, pp. 22652-22663, 2006.

Leschkies et al., "Photosensitization of ZnO Nanowires with CdSe Quantum Dots for Photovoltaic Devices," Nano Letters, vol. 7, No. 6, pp. 1793-1798, 2007.

Ma et al., "A Sensitive Method for the Detection of Catecholamine Based on Fourescence Quenching of CdSe Nanocrystals," Talanta, vol. 67, pp. 979-983, 2005.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Plass et al., "Quantum Dot Sensitization of Organic-Inorganic Hybrid Solar Cells," Journal Phys. Chemistry B, vol. 106, No. 31, pp. 7578-7580, 2002.

Quintana et al., "Comparison of Dye-Sensitized ZnO and $TiO_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).

Sharma et al., "Photoinduced Charge Transfer Between CdSe Quantum Dots and p-Phenylenediamine," Journal Phys. Chemistry B, vol. 107, No. 37, pp. 10088-10093, 2003.

Snaith et al., "Self-Organization of Nanocrystals in Polymer Brushes. Application in Heterojunction Photovoltaic Diodes," Nano Letters, vol. 5, No. 9, pp. 1653-1657, 2005.

Wu et al., "Phosphate-Modified $TiO_2$ Nanoparticles for Selective Detection of Dopamine, Levodopa, Adrenaline, and Catechol Based on Flourescence Quenching," Langmuir, vol. 23, No. 14, pp. 7880-7885, 2007.

Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).

Afzal, "Studies of Cephradine Metal Interactions," 342 pages, Oct. 1998.

Anacona et al., "Synthesis and Antibacterial Activity of Cefotaxime Metal Complexes," Journal of the Chilean Chemical Society, vol. 50, No. 2, 7 pages, Jun. 2005.

Anacona et al., "Synthesis and Antibacterial Activity of Cefoxitin Metal Complexes," Transition Metal Chemistry, vol. 30, pp. 605-609, 2005.

Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.

Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.

Diol Et al., "Electron Transfer Dynamics at GaAs Surface Quantum Wells," Journal of Physical Chemistry B, vol. 102, pp. 6193-6201, 1998.

El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.

Enescu, Medicamente, pp. 292-293, 2005.

Enright et al., "Spectroscopic Determination of Electron and Hole Effective Masses in a Nanocrystalline Semiconductor Film," Journal of Physical Chemistry vol. 100, No. 3, pp. 1027-1035, 1996.

Galoppini, "Linkers for Anchoring Sesitizers to Semiconductor Nanoparticles," Coordination Chemistry Reviews vol. 248, pp. 1283-1297, 2004.

Gautam et al., "Soft Chemical Routes to Semiconductor Nanostructures," Pramana Journal of Physics, vol. 65, No. 4, pp. 549-564, Oct. 2005.

Gregg, "Excitonic Solar Cells," Journal of Physical Chemistry B., vol. 107, pp. 4688-4698, No. 20, May 1, 2003.

Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.

http://en.wikipedia.org/wiki/Quantum_dot_solar_cell, "Nanocrystal Solar Cell," 1 page, printed Oct. 17, 2007.

http://findarticles.com/articles/mi_qa3776/is_200605ai_n17176721/print, "Ultradense GaN Nanopillar and Nanopore Arrays by Self-Assembly Nanopatterning," 4 pages, May 5, 2008.

http://www.evidenttech.com, Evident Technologies Webpages, 11 pages, printed Oct. 17, 2007.

http://www.i-sis.org.uk/QDAUESC.php, "Quantum Dots and Ultra-Efficient Solar Cells?" ISIS Press Release, Jan. 19, 2006.
Hwang et al., "A Highly Efficient Organic Sensitizer for Dye-Sensitized Solar Cells," Chemical Communications, 5 pages, printed Sep. 27, 2007.
ISBN No. 7-04-009141-0, 8 pages, 2001, 2003.
ISBN No. 978-7-03-015873-4, 8 pages, 2005.
Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.
Kim et al., "Enhanced Photocatalytic Activity in Composites of $TiO_2$ Nanotubes and Cds Nanoparticles," Chem. Commun., pp. 5024-5026, 2006.
Klimov, "Spectral and Dynamical Properties of Multiexcitons in Semiconductor Nanocrystals," ANRV, vol. 308-PC58-24, pp. 635-673, Dec. 2, 2006.
Kouklin et al., "Ultradense GaN Nanopillar and Nanopore Arrays by Self-Assembly and Nanopatterning," Journal of Electronic Materials, vol. 35, No. 5, pp. 1133-1137, May 2006.
Kuzyk, "Erratum: Physical Limits on Electronic Nonlinear Molecular Susceptibilities," Physical Review Letters, vol. 90, No. 3, 1 page, Jan. 2003.
Kuzyk, "Fundamental Limits on Third-Order Molecular Susceptibilities," Optics Letters, vol. 25, No. 16, pp. 1183-1185, Aug. 15, 2000.
Kuzyk, "Physical Limits on Electronic Nonlinear Molecular Susceptibilities," Physical Review Letters, vol. 85, No. 6, pp. 1218-1221, Aug. 7, 2000.
Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.
Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.
Li et al., "Band-Structure-Corrected Local Density Approximation Study of Semiconductor Quantum Dots and Wires," Physical Review B., vol. 72, 15 pages, 2005.
Li et al., "Conducting Polythiophenes with a Broad Spectrum of Reactive Groups," Journal of Polymer Science A, Polymer Chemistry, vol. 43, pp. 4547-4558, 2005.
Li et al., "Review of Recent Progress in Solid-State Dye-Sensitized Solar Cells," Solar Energy Materials and Solar Cells, vol. 90, pp. 549-573, 2006.
Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.
Marcus et al, "Electron Transfers in Chemistry and Biology," Biochimica et Biophysica Acta, vol. 811, pp. 265-322, 1985.
Marcus et al., "Electron Transfer Reactions in Chemistry, Theory and Experiment," Reviews of Modern Physics, vol. 65, No. 3, pp. 599-610, Jul. 1993.
Marcus, "Electrostatic Free Energy and Other Properties of States Having Nonequilibrium Polarization. I," The Journal of Chemical Physics, vol. 24, No. 5, 11 pages, May 1956.
Marcus, "On the Theory of Oxidation-Reduction Reactions Involving Electron Transfer. I," The Journal of Chemical Physics, vol. 24, No. 5, 13 pages, May 1956.
Meier et al., "Fast Electron Transfer Across Semiconductor-Molecule Interfaces: GaAs/Co(Cp)$_2$," Journal of Physical Chemistry B., vol. 103, pp. 2122-2141, 1999.
Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.
Morrison et al., Organic Chemistry, Sixth Edition, Chapter 6, pp. 240-242, 1992.
Neale et al., "Effect of a Coadsorbent on the Performance of Dye-Sensitized $TiO_2$ Solar Cells: Shielding Versus Band-Edge Movement," Journal of Physical Chemistry B., vol. 109, No. 49, pp. 23183-23189, 2005.
Nenitescu, Chimie Organica, vol. I, p. 522, 1980.
Nenitescu, Chimie Organica, vol. II, p. 581, 1980.
Nilsing et al., "Phosphonic Acid Adsorption at the $TiO_2$ Anatase (101) Surface Investigated by Periodic Hybrid HF-DFT Computations," Surface Science, vol. 582, pp. 49-60, 2005.
Nozick et al., "Quantum Dot Solar Cells," Physica E, vol. 14, pp. 115-120, 2002.
O'Reagan et al., "A Low-Cost, High Efficiency Solar Cell Based on Dye-Sensitized Colloidal $TiO_2$ Films," Nature, vol. 353, pp. 737-740, Oct. 24, 1991.
Oyaizu et al., "Linear Ladder-Type Conjugated Polymers Composed of Fused Thiophene Ring Systems," Macromolecules, vol. 37, No. 4, pp. 1257-1270, 2004.
Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.
Perez-Moreno et al., "Modulated Conjugation as a Means for Attaining a Record High Intrinsic Hyperpolarizability," Optics Letters, vol. 32, No. 1, pp. 59-61, Jan. 1, 2007.
Pomerantz et al., "Synthesis and Properties of Poly[3-(w-bromoalkyl)thiophene]," Synthetic Metals, vol. 101, 1 page, 1999.
Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.
Qian et al., "Gallium Nitride-Based Nanowire Radial Heterostructures for Nanophotonics," NanoLetters, vol. 4, No. 10, pp. 1975-1979, 2004.
Qiu et al., "Fabrication of $TiO_2$ Nanotube Film by Well-Aligned ZnO Nanorod Array Film and Sol-Gel Process," Thin Solid Films, vol. 515, pp. 2897-2902, 2007.
Robel et al., "Quantum Dot Solar Cells, Harvesting Light Energy with CdSe Nanocrystals Molecularly Linked to Mesoscopic $TiO_2$ Films," Journal of the American Chemical Society, vol. 128, No. 7, pp. 2385-2393, 2006.
Robel et al., "Size-Dependent Electron Injection from Excited CdSeQuantum Dots into $TiO_2$ Nanoparticles," JACS Communications, 2 pages, Mar. 21, 2007.
Wang et al. "Enhance the Performance of Dye-Sensitized Solar Cells by Co-grafting Amphiphilic Sensitizer and Hexadecylmalonic Acid on $TiO_2$ Nanocrystals," Journal of Physical Chemistry B., vol. 107, No. 51, pp. 14336-14341, 2003.
Wu et al., "Superior Radiation Resistance of $In_{1-x}Ga_xN$ Alloys: Full-Solar-Spectrum Photovoltaic Material System," Journal of Applied Physics, vol. 24, No. 10, pp. 6477-6482, Nov. 15, 2003.
Xu et al., "New Triphenylamine-Based Dyes for Dye-Sensitized Solar Cells," Journal of Physical Chemistry C, vol. 112, No. 3, pp. 874-880, 2008.
Yum et al., "Efficient Co-Sensitization of Nanocrystalline $TiO_2$ Films by Organic Sensitizers," Chemical Communications, 7 pages, printed Sep. 27, 2007.
Chang et al., "Chemical Bath Deposition of CdS Quantum Dots Onto Mesoscopic $TiO_2$ Films for Application in Quantum-Dot-Sensitized Solar Cells," Applied Physics Letters, vol. 91, 3 pages, 2007.
U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/484,034, filed Jun. 12, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.
Hodes, "Chemical Solution Deposition of Semiconductor Films," Marcel Dekker Inc., 381 pages, 2002.
Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.

Dennler et al., "Polymer-Fullerene Bulk-Heterojunction Solar Cells," Advanced Materials, vol. 21, pp. 1323-1338, 2009.

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

* cited by examiner

QUANTUM DOT SOLAR CELL

PRIORITY

This application claims priority under 35 U.S.C. §119 to U.S. Provisional Application Ser. No. 61/080,949 entitled "QUANTUM DOT SOLAR CELL" filed Jul. 15, 2008, the entirety of which is incorporated herein by reference.

TECHNICAL FIELD

The disclosure relates generally to solar cells, and more particularly to quantum dot solar cells.

SUMMARY

The disclosure pertains generally to solar cells. In some instances, a solar cell may include quantum dots as light sensitizers.

An example solar cell may include an electron conductor layer, a quantum dot layer, a bifunctional ligand layer coupling the electron conductor layer and the quantum dot layer, and a hole conductor layer coupled to the quantum dot layer. The bifunctional ligand layer may include an antibiotic, and in some cases, a cephalosporin-based antibiotic.

Another example solar cell may include an electron conductor layer comprising titanium dioxide, a plurality of quantum dots, a plurality of bifunctional ligands, and a hole conductor layer comprising a conductive polymer including a plurality of monomers. At least some of the plurality of bifunctional ligands may include an electron conductor anchor that bonds to the electron conductor layer and a quantum dot anchor that bonds to one of the plurality of quantum dots. At least some of the plurality of bifunctional ligands may include an antibiotic. At least some of the plurality of monomers may be functionalized with a second quantum dot anchor.

The above summary is not intended to describe each disclosed embodiment or every implementation of the disclosure. The Description which follows more particularly exemplifies various examples.

BRIEF DESCRIPTION OF THE FIGURES

The following description should be read with reference to the drawings. The drawings, which are not necessarily to scale, depict selected embodiments and are not intended to limit the scope of the disclosure. The disclosure may be more completely understood in consideration of the following detailed description of various embodiments in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments or examples described. On the contrary, the intention is to cover all modifications, equivalents, and alternatives falling within the spirit and scope of the invention.

DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

The term "alkyl" refers to a straight or branched chain monovalent hydrocarbon radical having a specified number of carbon atoms. Examples of "alkyl" include, but are not limited to, methyl, ethyl, n-propyl, isopropyl, n-butyl, s-butyl, t-butyl, n-pentyl, n-hexyl, 3-methylpentyl, and the like.

Figure 1:
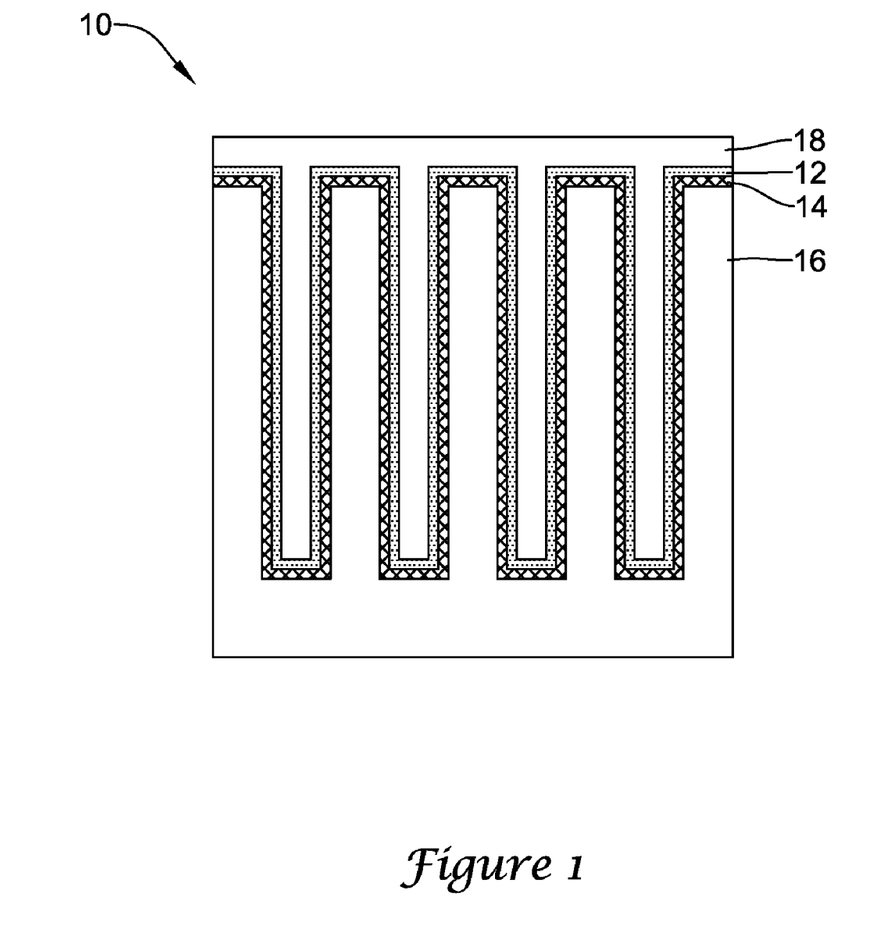
FIG. 1 is a schematic cross-sectional side view of an illustrative but non-limiting example of a solar cell.

FIG. 1 is a schematic cross-sectional side view of an illustrative solar cell 10. In the illustrative example shown in FIG. 1, there may be a three-dimensional intermingling or interpenetration of the layers forming solar cell 10, but this is not required. The illustrative solar cell 10 includes a quantum dot layer 12. Quantum dot layer 12 may schematically represent a single quantum dot. In some cases, quantum dot layer 12 may be considered as representing a large number of individual quantum dots.

In the illustrative embodiment of FIG. 1, a bifunctional ligand layer 14 is provided, and may schematically represent a single bifunctional ligand, such as those discussed below. In some cases, bifunctional ligand layer 14 may represent a large number of individual bifunctional ligands, with at least some of the bifunctional ligands within bifunctional ligand layer 14 bonded to corresponding quantum dots within quantum dot layer 12. The illustrative solar cell 10 of FIG. 1 also includes an electron conductor layer 16. In some cases, electron conductor layer 16 may be an n-type conductor as further discussed below. The illustrative solar cell 10 may further include a hole conductor layer 18. As discussed further below, hole conductor layer 18 may be a p-type conducting electrode layer.

Bifunctional ligand layer 14 may, in some instances, be considered as being coupled to quantum dot layer 12 as well as being coupled to electron conductor layer 16. At least some of the bifunctional ligands within bifunctional ligand layer 14 may be considered as including electron conductor anchors that may bond to electron conductor layer 12, and quantum dot anchors that may bond to individual quantum dots within quantum dot layer 16. Hole conductor layer 18 may also be considered as being coupled to quantum dot layer 12. In some cases, two layers may be considered as being coupled if one or more molecules or other moieties within one layer are bonded or otherwise secured to one or more molecules within another layer. In some instances, coupling infers the potential passage of electrons from one layer to the next.

Quantum dot layer 12 may include one quantum dot or a plurality of quantum dots. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups II-VI, III-V, or IV-VI materials. The quantum dots employed herein may be formed using any appropriate technique. Examples of specific pairs of materials for forming quantum dots include, but are not limited to, MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb.

Figure 2:
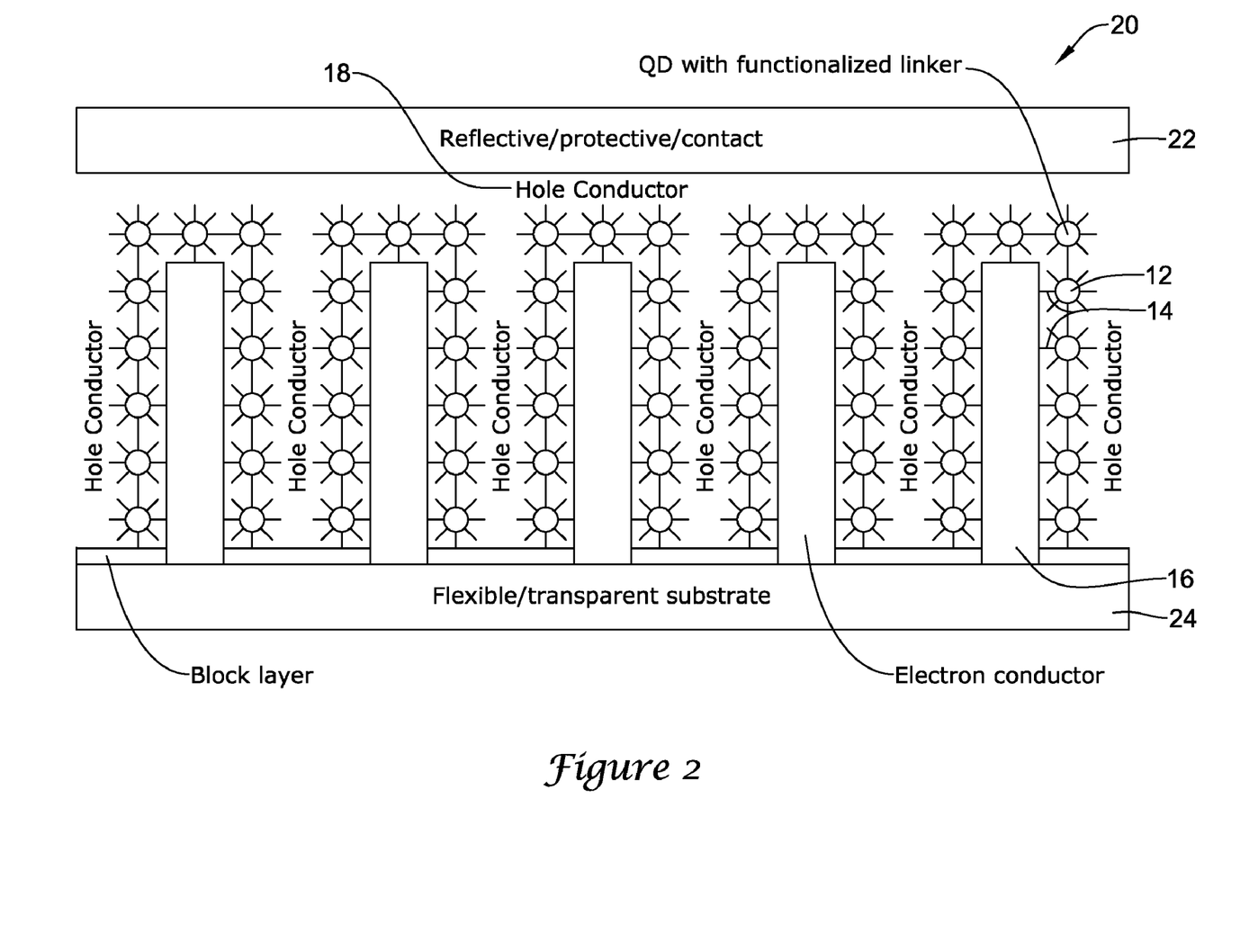
FIG. 2 is a schematic cross-sectional side view of another illustrative but non-limiting example of a solar cell.

FIG. 2 is a schematic cross-sectional side view of an illustrative solar cell 20 that is similar to solar cell 10 (FIG. 1). In some cases, a reflective and/or protecting layer 22 may be disposed over the hole conductor layer 18, as shown. The reflective and/or protecting layer 22 may be a conductive layer. In some instances, the reflective and/or protecting layer 22 may include a Pt/Au/C film as both catalyst and conductor, but this is not required. Alternatively, or in addition, a flexible and transparent substrate 24, shown at the lower side (in the illustrated orientation) of FIG. 2, may be secured to the electron conductor layer 16. Alternatively, the flexible and transparent substrate 24, when provided, may be or function as the electron conductor layer 16, and in some cases, may be an n-type electron conductor that is transparent or at least substantially transparent to at least some wavelengths of light within the visible portion of the electromagnetic spectrum.

As described with respect to FIG. 1, solar cell 10 may include a bifunctional ligand layer 14. In some cases, bifunctional ligand layer 14 may include a single bifunctional ligand or a large number of bifunctional ligands. A bifunctional ligand may, in some cases, be considered as improving electron transfer by reducing the energy barriers for electron transfer. A bifunctional ligand may provide a conduit so that electrons that are ejected by the quantum dot can travel to and through the electron conductor 16. A bifunctional ligand may, for example, secure the quantum dots relative to the electron conductor 16 and/or any other related structure.

The bifunctional ligand may include electron conductor anchor for bonding to the electron conductor 16 and a quantum dot anchor for bonding to the quantum dots. In some instances, the electron conductor anchor may include a carboxylic acid moiety, an amide moiety, an ether or an acid halide. In some instances, the quantum dot anchor may be selected to bond well to a particular quantum dot. To illustrate, $Ag_2S$, CdSe, CdTe and CdS are examples of quantum dots that may be employed in the light sensitive assemblies discussed herein.

In some instances, the bifunctional ligand may include an antibiotic, and in some cases, a cephalosporin-based ligand. In some instances, these ligands may be considered as including a carboxyl group that will bond or otherwise link to an electron conductor such as titanium dioxide, as well as a sulfur atom that will bond or otherwise link to quantum dots. A variety of cephalorsporine-based ligands are suitable. An illustrative but non-limiting example of a suitable bifunctional ligand is 7-aminocephalorosporanic acid, which has the structure:

A number of suitable bifunctional ligands share the following core structure:

where $R_1$ and $R_2$ are defined below.

Another example bifunctional ligand may include cefditoren, in which $R_1$ and $R_2$ are as shown, respectively:

Another example bifunctional ligand may include ceftazidime, in which $R_1$ and $R_2$ are as shown, respectively:

In this example, the carboxylic acid group (e.g., COOH) of the core structure is reduced (e.g., to $COO^-$).

Another example bifunctional ligand may include cefonicid, in which $R_1$ and $R_2$ are as shown, respectively:

Another example bifunctional ligand may include ceftezol, in which $R_1$ and $R_2$ are as shown, respectively:

Another example bifunctional ligand may include cefaclor, in which $R_1$ is a chloride ion and $R_2$ is as shown:

Another example bifunctional ligand may include cephalothin, in which $R_1$ and $R_2$ are as shown, respectively:

Another example bifunctional ligand may include cephradine, in which $R_1$ is a methyl group and $R_2$ is as shown:

Another example bifunctional ligand may include cephaloridine, in which $R_1$ and $R_2$ are as shown, respectively:

In this example, the carboxylic acid group (e.g., COOH) of the core structure is reduced (e.g., to COO⁻).

Another example bifunctional ligand may include cefuroxime, in which $R_1$ and $R_2$ are as shown, respectively:

Another example bifunctional ligand may include cefatrizine, in which $R_1$ and $R_2$ are as shown, respectively:

Another example bifunctional ligand may include cefamandole, in which $R_1$ and $R_2$ are as shown, respectively:

Another example bifunctional ligand may include cefadroxile, in which $R_1$ is a methyl group and $R_2$ is as shown:

Another example bifunctional ligand may include cefdinin, in which $R_1$ and $R_2$ are as shown, respectively:

Another example bifunctional ligand may include holospor, in which $R_1$ and $R_2$ are as shown, respectively:

Another example bifunctional ligand may include cephalorsporine C, in which $R_1$ and $R_2$ are as shown, respectively:

Another example bifunctional ligand may include cefcapene, in which $R_1$ and $R_2$ are as shown, respectively:

Another example bifunctional ligand may include cephapirin, in which $R_1$ and $R_2$ are as shown, respectively:

Another example bifunctional ligand may include cephacetrile, in which $R_1$ and $R_2$ are as shown, respectively:

MeCOOCH₂ and NCCH₂.

Another example bifunctional ligand may include cephalexin, in which $R_1$ is a methyl group and $R_2$ is as shown:

Another example bifunctional ligand may include cefpiramide, in which $R_1$ and $R_2$ are as shown, respectively:

Another example bifunctional ligand may include cephaloglycin, in which $R_1$ and $R_2$ are as shown, respectively:

Another example bifunctional ligand may include ceforamide, in which $R_1$ and $R_2$ are as shown, respectively:

Another example bifunctional ligand may include cefprozil, in which $R_1$ and $R_2$ are as shown, respectively:

It will be recognized that at least some of the bifunctional ligands described herein include carbon-carbon double bonds and thus some of the molecules may be considered as being either Z (same side) isomers or E (opposite side) isomers. In some cases, a solar cell including a number of bifunctional ligands may include only stereospecific bifunctional ligands, i.e., all Z isomers or all E isomers, for example. In other instances, a solar cell including a number of bifunctional ligands may include one or more Z isomers and one or more E isomers.

In some cases, a light sensitive assembly or a solar cell may include one or a number of bifunctional ligands. In some instances, a solar cell may include a number of bifunctional ligands that are isomers having the same molecular formula. These isomers may, for example, be dextrorotatory molecules, levorotatory molecules or a racemic mixture thereof. In some cases, a light sensitive assembly or solar cell may include a large number of bifunctional ligands representing a plurality of chemically different bifunctional ligands. Each group or subset of bifunctional ligands, either separately or in combination, may be dextrorotatory, levorotatory or a racemic mixture thereof.

Referring back to FIG. 1, the illustrative solar cell 10 may include electron conductor layer 16, which may be formed of any suitable material or material combination. In some cases, the electron conductor layer 16 may be an n-type electron conductor. The electron conductor layer 16 may be metallic, such as $TiO_2$ or ZnO. In some cases, electron conductor layer 16 may be an electrically conducting polymer, such as a polymer that has been doped to be electrically conducting or to improve its electrical conductivity.

As discussed with respect to FIG. 1, the illustrative solar cell 10 may include hole conductor layer 18 that is configured to reduce a quantum dot once the quantum dot has absorbed a photon and ejected an electron through the bifunctional ligand to the electron conductor. While not required, in some instances, the hole conductor may be a conductive polymer. In some cases, the conductive polymer may include a monomer that has an alkyl chain that terminates in a second quantum dot anchor. The conductive polymer may, for example, be or otherwise include a polythiophene that is functionalized with a moiety that bonds to quantum dots. In some cases, the polythiophene may be functionalized with a thio or thioether moiety.

An illustrative but non-limiting example of a suitable conductive polymer has as a repeating unit, where R is H or alkyl and m is an integer ranging from about 6 to about 12.

Another illustrative but non-limiting example of a suitable conductive polymer has as a repeating unit, where R is H or alkyl.

Another illustrative but non-limiting example of a suitable conductive polymer has as a repeating unit, where R is H or alkyl.

Another illustrative but non-limiting example of a suitable conductive polymer has as a repeating unit, where R is H or alkyl.

In at least some embodiments, hole conductor layer 18 comprises a conductive polymer that includes:

as a repeating unit, where R is H or alkyl.

A solar cell may, for example, be assembled by growing nanoparticles of n-type semiconducting titanium dioxide on a glass substrate, optionally followed by a sintering process. Next, the quantum dots, the bifunctional ligands and the conducting polymer may be synthesized. Finally, the solar cell may be assembled by combining the individual components in a one-pot synthesis.

The disclosure should not be considered limited to the particular examples described herein, but rather should be understood to cover all aspects of the invention as set out in the attached claims. Various modifications, equivalent processes, as well as numerous structures to which the invention can be applicable will be readily apparent to those of skill in the art upon review of the instant specification.

We claim:

1. A solar cell, comprising: an electron conductor layer; a quantum dot layer; a hole conductor layer coupled to the quantum dot layer;
a bifunctional ligand layer coupling the electron conductor layer and the quantum dot layer; wherein the bifunctional ligand layer comprises one or more cephalosporin-based ligand(s) selected from the group consisting of where $R_1$ and $R_2$ respectively are

-continued where $R_3$ and $R_4$ respectively are

2. The solar cell of claim 1, wherein the hole conductor layer comprises a conductive polymer that comprises as a repeating unit.

3. The solar cell of claim 1, where in the hole conductor layer comprises a conductive polymer.

4. The solar cell of claim 1, wherein the hole conductor layer comprises a conductive polymer that comprises as a repeating unit, where R is H or alkyl.

5. The solar cell of claim 1, wherein the hole conductor layer comprises a conductive polymer that comprises as a repeating unit, where R is H or alkyl and m in an integer ranging from about 6 to about 12.

6. The solar cell of claim 1, where in the electron conductor layer comprises titanium dioxide.

7. A solar cell, comprising: an electron conductor layer; a quantum dot layer; a hole conductor layer coupled to the quantum dot layer;
a bifunctional ligand layer coupling the electron conductor layer and the quantum dot layer; where in the bifunctional ligand layer comprises one or more cephalosporin-based ligand(s) selected from the group consisting of where $R_1$ and $R_2$ respectively are where $R_3$ and $R_4$ respectively are where $R_5$ is a chloride ion and $R_6$ is 8. A solar cell, comprising: an electron conductor layer; a quantum dot layer; a hole conductor layer coupled to the quantum dot layer; a bifunctional ligand layer coupling the electron conductor layer and the quantum dot layer; where in the bifunctional ligand layer comprises one or more cephalosporin-based ligand(s) selected from the group consisting of where $R_1$ and $R_2$ respectively are where $R_3$ is methyl and $R_4$ is where $R_5$ and $R_6$ respectively are

9. A solar cell, comprising: an electron conductor layer; a quantum dot layer; a hole conductor layer coupled to the quantum dot layer; a bifunctional ligand layer coupling the electron conductor layer and the quantum dot layer; where in the bifunctional ligand layer comprises one or more cephalosporin-based ligand(s) selected from the group consisting of where $R_1$ and $R_2$ respectively are

-continued where R₃ and R₄ respectively are where R₅ and R₆ respectively are

10. A solar cell, comprising: an electron conductor layer; a quantum dot layer; a hole conductor layer coupled to the quantum dot layer; a bifunctional ligand layer coupling the electron conductor layer and the quantum dot layer; where in the bifunctional ligand layer comprises one or more cephalosporin-based ligand(s) selected from the group consisting of where R₁ is methyl and R₂ is where R₃ and R₄ respectively are where R₅ and R₆ respectively are

11. A solar cell, comprising: an electron conductor layer; a quantum dot layer; a hole conductor layer coupled to the quantum dot layer; a bifunctional ligand layer coupling the electron conductor layer and the quantum dot layer; where in the bifunctional ligand layer comprises one or more cephalosporin-based ligand(s) selected from the group consisting of where R₁ and R₂ respectively are where R₃ and R₄ respectively are

-continued where $R_5$ and $R_6$ respectively are and

12. A solar cell, comprising: an electron conductor layer; a quantum dot layer; a hole conductor layer coupled to the quantum dot layer; a bifunctional ligand layer coupling the electron conductor layer and the quantum dot layer; where in the bifunctional ligand layer comprises one or more cephalosporin-based ligand(s) selected from the group consisting of where $R_1$ and $R_2$ respectively are where $R_3$ is methyl and $R_4$ is where $R_5$ and $R_6$ respectively are

-continued

13. A solar cell, comprising: an electron conductor layer; a quantum dot layer; a hole conductor layer coupled to the quantum dot layer; a bifunctional ligand layer coupling the electron conductor layer and the quantum dot layer; where in the bifunctional ligand layer comprises one or more cephalosporin-based ligand(s) selected from the group consisting of where $R_1$ and $R_2$ respectively are where $R_3$ and $R_4$ respectively are where $R_5$ and $R_6$ respectively are

* * * * *